US005789712A

United States Patent [19]
Barry et al.

[11] Patent Number: 5,789,712
[45] Date of Patent: Aug. 4, 1998

[54] TOROID HOLDER

[75] Inventors: John Brett Barry, Downers Grove; G. Russell Ashdown, Lake Bluff, both of Ill.

[73] Assignee: Power Trends, Inc., Warrenville, Ill.

[21] Appl. No.: 684,191

[22] Filed: Jul. 19, 1996

[51] Int. Cl.[6] .................................................. H01B 17/00
[52] U.S. Cl. .................................. 174/138 G; 336/60
[58] Field of Search .......................... 174/138 G, 138 H, 174/138 J, 65 R, 53; 336/59, 60

[56] References Cited

U.S. PATENT DOCUMENTS

| | | | |
|---|---|---|---|
| 2,533,673 | 12/1950 | Lasserre | 174/59 |
| 2,917,724 | 7/1959 | Jackson | 339/198 |
| 4,221,148 | 9/1980 | Lewis | 83/869 |
| 5,306,870 | 4/1994 | Abat | 174/65 R |

*Primary Examiner*—Kristine L. Kincaid
*Assistant Examiner*—Dhiru R. Patel
*Attorney, Agent, or Firm*—Hill & Simpson

[57] ABSTRACT

A holder for a toroid coil has a planar top surface for engagement by a vacuum pickup and four side walls extending to a mounting plane and defining a toroid containing space therewithin. Wire wrap posts extend from one side of the holder and wire pass through openings enable the wire to hold the coil in place while permitting the solder connection location to lie outside the holder in view for inspection.

20 Claims, 1 Drawing Sheet

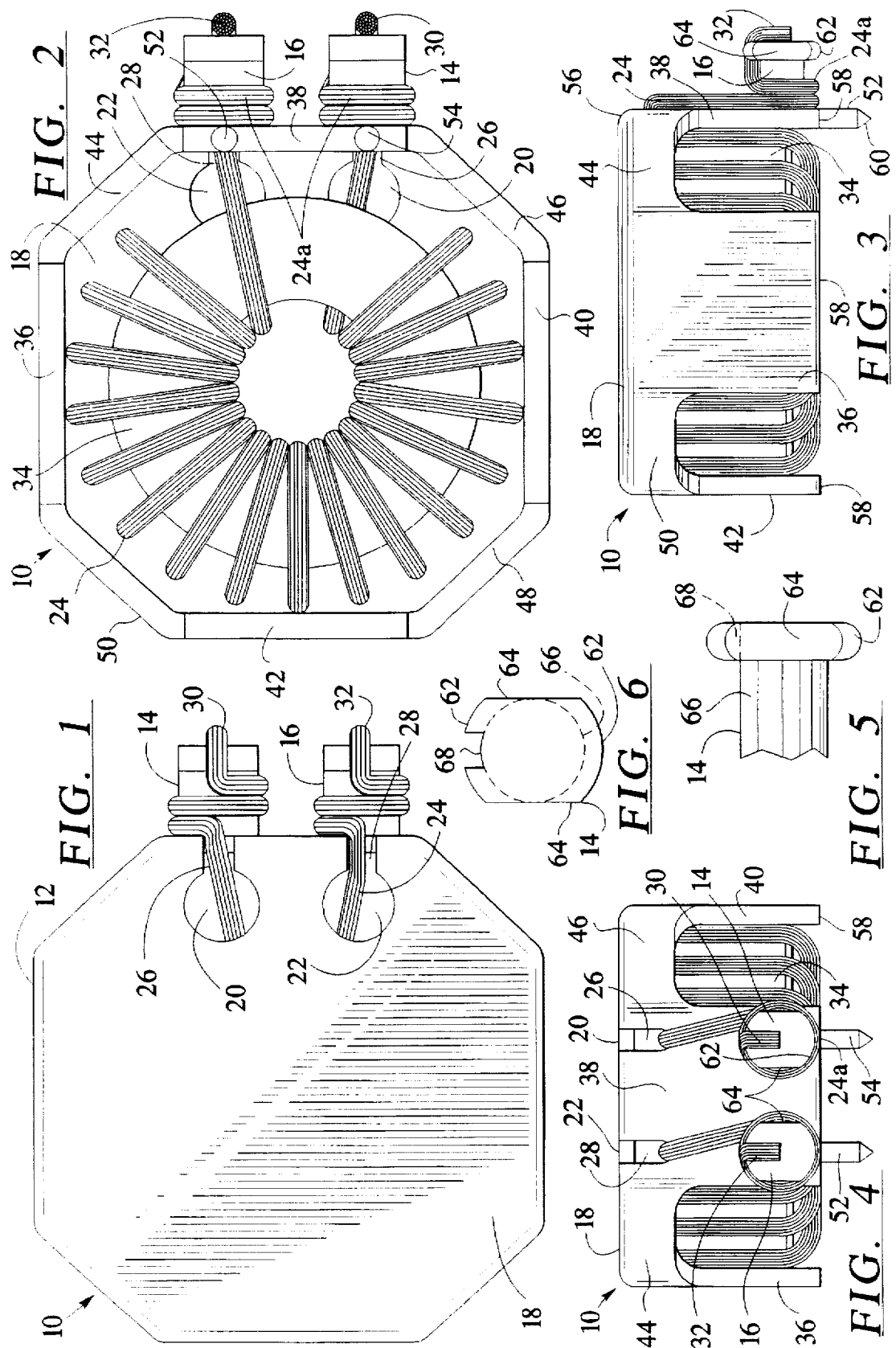

TOROID HOLDER

BACKGROUND OF THE INVENTION

1. Field of the Invention

The present invention relates generally to a holder for a toroid, and more particularly, to a toroid holder that enables automated mounting of the toroid on a circuit board.

2. Description of the Related Art

Toroid coils are used in electrical circuits including those provided on circuit boards. The shape of the toroid coil makes mounting of the coil on the circuit board time consuming and difficult, especially by automated circuit board equipping machinery.

SUMMARY OF THE INVENTION

An object of the present invention is to provide a holder for a toroid coil which permits the toroid to be picked up and held by automated circuit board equipping machinery.

Another object of the invention is to provide a holder for a toroid that provides a vacuum pickup surface.

A further object of the present invention is to provide a toroid holder that enables a toroid to be mounted on a circuit board, preferably using surface mount techniques, which occupies the least amount of space possible.

Yet another object of the invention is to provide a holder for a toroid which securely holds the toroid in place yet which prevents liquid used in circuit board processing from being trapped in the holder.

These an other objects and advantages of the invention are achieved by a holder for a toroid coil that includes a top generally planar member having edges with side walls extending from the edges toward a mounting plane to define a toroid containment space between the planar top member and the mounting plane and between the side walls. The side walls include a mounting side wall with wire mounting posts extending from the mounting side wall.

BRIEF DESCRIPTION OF THE DRAWINGS

FIG. 1 is a top plan view of the toroid holder of the present invention;

FIG. 2 is a bottom plan view of the toroid holder of FIG. 1;

FIG. 3 is a side elevational view of the present toroid holder;

FIG. 4 is an end elevational view of the toroid holder;

FIG. 5 is an enlarged fragmentary side view of a wire post of the present toroid holder; and FIG. 6 is an enlarged end view of the wire post of FIG. 5.

DETAILED DESCRIPTION OF THE PREFERRED EMBODIMENTS

In FIG. 1 of the drawings, the present toroid holder, indicated generally by reference character 10, has a body 12 which is octagonal in shape and has two wire posts 14 and 16 extending from one side of the body 12. The body 12 has a top member 18 which forms a planar surface that is engaged by a vacuum pick up nozzle of automated circuit board equipping machinery so that the holder 10 and the toroid coil contained therein can be picked up and placed on a circuit board. The top member 18 provides a large enough surface to allow for a large diameter pick up nozzle which would be required to support the mass of the holder and the toroid.

The top member 18 has two wire feed-through openings 20 and 22 through which wires 24 of the coil pass. The wire feed-through openings 20 and 22 are adjacent the wire posts 14 and 16, respectively, so that a wire 24 passing through the opening 20 from the inside can be easily brought to the wire post 14 for wrapping. Similarly, the opening 22 permits the wire 24 to be brought to the post 16 for wrapping. The position of the openings 20 and 22 to the side of the top member also ensures that a large, unperforated surface is available for the vacuum pick up nozzle. The openings 20 and 22 are circular in shape and are large enough that the wire 24 can be fed through without difficulty. Additional wire slots 26 and 28, which are narrower than the openings 20 and 22, extend from the openings 20 and 22 toward the posts 14 and 16, respectively. The wire moves into the slots 26 and 28 as it is brought to the posts 14 and 16.

The wire 24 is wrapped twice around each of the posts 14 and 16, although other numbers of wraps are also possible, and then the ends 30 and 32 of the wire 24 are turned down over the ends of the respective posts 14 and 16.

The holder 10, including the body 12 and the posts 14 and 16, is molded in one piece of a plastic material. In one embodiment, the material is nylon 46, fiberglass reinforced, heat stabilized plastic. Any material which has sufficient rigidity and sufficient heat deflection temperature to withstand circuit board assembly processes may be used. The size of the toroid holder 10 of one embodiment is about 4/10 inch (1 cm) across the body.

FIG. 2 shows the bottom view of the toroid holder 10 including the toroid coil 34 which has a toroidal shaped core 34 with the wire 24 wrapped therearound. The toroid 34 is held under the top member 18 and within side walls 36, 38, 40 and 42. The side walls 36, 38, 40 and 42 extend downward from the top member 18 at four sides of the octagonal top 18 to form five partial walls of a cube. The side walls 36, 38, 40 and 42 extend to a mounting plane, as will be discussed hereinafter. The four intervening sides of the octagonal top member 18 have only wall portions 44, 46, 48 and 50 which do not extend to the mounting plane and so form openings that are referred to here as corner openings.

The wire posts 14 and 16 both extend from the side wall 38. The wire posts 14 and 16 are parallel to one another and extend for a distance of about 6/100 inch (1.5 mm) from the side wall 38. On the side wall 38 aligned with the wire posts are two positioning pins 52 and 54 which extend downward from the lower edge of the side wall 38. The wire 24 is wrapped around the posts 14 and 16 to provide solder locations 24a at the wire portion on the underside of the posts 14 and 16.

Referring to FIG. 3, the side view of the toroid holder 10 shows the planar top surface of the top member 18 which is engaged by the vacuum pick up, as is known, of the automatic equipping machinery. The top member 18 is joined to the side walls 36, 38, 40 (see FIG. 2) and 42 as well as to the wall portions 44, 46, 48 (see FIG. 2) and 50 by a radius 56 which adds strength to the structure of the holder 10 and increases the ease of molding. The wall portions 44, 46, 48 and 50 also add to the strength of the holder 10.

The side walls 36, 38, 40 (see FIG. 2) and 42 extend from the top member 18 to the mounting plane 58, which is defined by the lower end of the walls. As can be seen, the positioning pins 52 and 54 extend below the mounting plane 58 and will extend into openings in a circuit board to position the holder in the proper orientation. The positioning pins 52 and 54 are each provided with a taper 60 at the lower end to facilitate insertion of the pins in the circuit board openings.

The wire posts 14 and 16 extend from the side wall 38 adjacent the mounting plane 58 so that wire 24 wrapped around the posts 14 and 16 comes into contact with the circuit board, thereby enabling surface mount techniques to be used to the connect the wire 24 to other circuit elements on the circuit board. In particular, the wire 24 extends into the mounting plane 58 at the solder locations 24a on the underside of the posts 14 and 16. As indicated before, the length of the wire posts 14 and 16 is sufficient to hold two wraps of the wire 24. One wrap may be sufficient, however. The free end of the wire posts 14 and 16 is provided with a lip 62 that projects transversely from the cylindrical posts. The lip 62 has a flat bevel 64 on each side of the posts 14 and 16 in a direction perpendicular to the mounting plane 58.

The end view of FIG. 4 shows the wire slots 26 and 28 extending from the top member 18 into the side wall 38 over each of the corresponding wire posts 14 and 16. The wire 24 in the slots 26 and 28 prevents the wire from extending above the vacuum nozzle engagement plane of the top member 18. The position of the wire feed through openings 20 and 22 in the top member 18 results in the toroid coil 34 being pulled upward into the holder 10 as the wire ends 24 are pulled through the openings 20 and 22. The wire 24 is then moved down into the slots 26 and 28 which holds the toroid 34 snug against the underside of the top member 18 without any further securing means. The wire 24 is wrapped around the wire posts 14 and 16 after passing through the slots 26 and 28 so that both ends of the wire 24 approach the posts 14 and 16 from the same direction. This helps to minimize memory effects in the wire 24.

The flat bevels 64 can be seen on each side of the wire posts 14 and 16, and the ends 30 and 32 of the wire 24 can be seen bent over the free end of the posts 14 and 16 in FIG. 4. One of the wire posts 14 is also shown in the enlarged views of FIGS. 5 and 6. The post 14 has a cylindrical shaft 66 which ends in the lip 62 at the free end. The lip 62 prevents the wraps of wire 24 from slipping off the end of the posts 14 and 16. The lip 62 has the two bevels 64 that form flat grip surfaces. The lip 62 also has a notch 68 on the top of the post 14 into which each end of the wire 24 is secured, as shown in FIGS. 2-4. This notch 68 provides consistent wire termination for the present device.

Although two wraps of the wire 24 are shown around each of the posts 14 and 16 in the FIGS. 1-3, it is contemplated that only one wrap of the wire is necessary for the present invention. The posts 14 and 16 are, in the preferred embodiment, a length to accomodate a maximum of two wraps of the wire 24. The posts 14 and 16 are dimensioned and positioned to ensure that the wire 24 will always contact the circuit board and that the holder 10 does not sit only on the ends of the side walls 36, 38, 40 and 42. The posts 14 and 16 hold the wire 24 in a position which is open to view to permit easy inspection of the solder joint between the wire 24 and the circuit board at the solder connection location 24a.

Thus, there is shown and described a holder for a toroid coil that allows for automatic pick up and mounting of the coil on a circuit board using surface mount techniques. The holder is shaped to make efficient use of space and material and provides a strong enclosure for the coil. The holder is not enclosed completely, however, so that aqueous baths, and the like, used in circuit board processing can drain through the openings and do not hold the liquid in the toroid holder.

Although other modifications and changes may be suggested by those skilled in the art, it is the intention of the inventors to embody within the patent warranted hereon all changes and modifications as reasonably and properly come within the scope of their contribution to the art.

We claim:

1. A toroid holder assembly for mounting on a circuit board, comprising:

a planar top member having edges;

side walls extending from said edges of said planar top member toward a mounting plane to define a toroid containment space between said planar top member and said mounting plane and between said side walls, said side walls including a mounting side wall;

wire mounting posts extending from said mounting side wall for mounting a wire; and a toroid coil in said containment space, said toroid coil having a core and a one wire wrapped about said core, said wire extending out of said containment space and engaging said wire mounting posts external to said toroid containment space.

2. A toroid holder assembly as claimed in claim 1, wherein said planar top member defines wire passage openings through which said wire extends from the toroid coil to said wire mounting posts.

3. A toroid holder assembly as claimed in claim 2, wherein said wire passage openings extend into said mounting side wall only to an extent that said wire extending from said toroid coil in said toroid holder assembly extends away from said mounting plane to said wire passage opening and bends toward said mounting plane to said wire mounting posts after passing through said wire passage opening so that said toroid coil in said toroid holder assembly is retained in said toroid holder by tension on said wire.

4. A toroid holder assembly as claimed in claim 1, wherein said wire mounting posts are two wire mounting posts extending parallel to one another from said mounting side wall.

5. A toroid holder assembly as claimed in claim 4, wherein said wire mounting posts each have a surface that is coplanar with said mounting plane so that said wire wrapped on said wire mounting posts extends into said mounting plane for surface mounting of said toroid holder assembly on said circuit board.

6. A toroid holder assembly as claimed in claim 1, wherein said side walls are four side walls.

7. A toroid holder assembly as claimed in claim 1, wherein said planar top member is of an octagonal shape.

8. A toroid holder assembly as claimed in claim 1, further comprising: at least one guide pin extending from at least one of said side walls into said mounting plane, said at least one guide pin having a tapered free end for extending into an opening in said circuit board.

9. A toroid holder assembly as claimed in claim 8, wherein said at least one guide pin extends from said mounting side wall.

10. A toroid holder assembly as claimed in claim 1, wherein said wire mounting post each include a slot at a free end for receiving said wire wrapped on said wire mounting posts.

11. A toroid holder assembly as claimed in claim 1, wherein said wire mounting posts include wire wrapping portions that are external to said toroid contain mount space, said wrapping portions being freely viewable for inspection from outside said toroid containment space.

12. A toroid holder to hold a toroid coil for mounting on a circuit board comprising:

a planar top member having edges;

side walls extending from said edges of said planar top member toward a mounting plane to define a toroid containment space between said planar top member and said mounting plane and between said side walls, said side walls including a mounting side wall;

wire mounting posts extending from said mounting side wall, said wire mounting posts each including a lip extending generally transverse of an axis of said wire mounting posts adjacent a free end of said wire mounting posts.

13. A toroid holder to hold a toroid coil for mounting on a circuit board, comprising:

a planar top member having edges;

side walls extending from said edges of said planar top member toward a mounting plane to define a toroid containment space between said planar top member and said mounting plane and between said side walls, said side walls including a mounting side wall;

wire mounting posts extending from said mounting side wall;

said side walls being free of one another to define corner gaps between each of said side walls.

14. A method for mounting a toroid coil on a printed circuit board, comprising the steps of:

inserting a wire from the toroid coil into wire passage openings in a toroid holder;

inserting the toroid coil into a toroid containment space in the toroid holder while pulling the wire through the wire passage openings until the toroid coil is seated in the toroid containment space;

winding the wire around two wire posts externally of the containment space;

cutting off the wire at the two wire posts; and mounting the toroid holder on a printed circuit board with the wire electrically connected to a printed circuit on the printed circuit board.

15. A method as claimed in claim 14, wherein said step of inserting the wire inserts the wire in a direction away from a mounting plane of the toroid holder, and further comprising the steps of:

bending a portion of the wire extending through the wire passage openings toward the mounting plane before said step of winding the wire around the two wire posts.

16. A method as claimed in claim 15, wherein said step of bending positions the wire free of a vacuum pickup plane on a top surface of the toroid holder, and further comprising the steps of:

placing the toroid holder on the printed circuit board using a vacuum pickup nozzle attached at the top surface.

17. A method as claimed in claim 14, wherein said step of winding the wire around the two wire posts winds the wire into the mounting plane so that the wire is electrically connected to said printed circuit on the printed circuit board by placement of the wire on the two wire posts on connection portions of the printed circuit.

18. A method as claimed in claim 14, further comprising the steps of:

inserting the wire through a slot in the wire two posts after said step of winding the wire around said two wire posts and before the step of cutting off the wire.

19. A toroid holder for mounting a toroid coil having lead wires on a printed circuit board, comprising:

a planar top member defining a vacuum pickup surface and having edges; side walls extending from said edges of said planar top member toward a mounting plane to define a toroid containment space between said planar top member and said mounting plane and between said side walls, said side walls defining spaces therebetween through which any liquid in the toroid containment space can escape, said side walls including a mounting side wall;

said planar top member and said mounting side wall defining two wire passage openings into said toroid containment space at one of said edges of said planar top member; two wire posts extending from said mounting side wall generally in a direction parallel to the mounting plane and adjacent the mounting plane so that wires wrapped about said two wire posts extend into the mounting plane, said two wire posts being positioned relative to said two wire passage openings so that said wires extending through said wire passage openings can be wound on corresponding ones of said wire posts, said wire passage openings being spaced farther from the mounting plane than said wire posts; an enlargement at an end of each of said two wire posts to prevent said wires wrapped about said posts from slipping off, a slot in said enlargement of each of said wire posts into which the wires can be inserted after being wound on said two wire posts; and guide pins on said mounting side wall extending through the mounting plane for engagement in holes in the printed circuit board, said guide pins being tapered at a free end.

20. A toroid holder as claimed in claim 19, wherein said two wire posts are parallel to one another, and said enlargement on each of said wire posts comprises a raised lip extending transversely of an axis of each of said wire posts, said raise lip having a first portion extending toward the mounting plane and a second portion extending away from the mounting plane, and defining flat side surfaces laterally of each of said wire posts.

* * * * *